United States Patent [19]

Ahn et al.

[11] 4,187,553
[45] Feb. 5, 1980

[54] PEDESTAL BUBBLE DOMAIN CHIP AND PROCESSES FOR MAKING SAME

[75] Inventors: Kie Y. Ahn, Chappaqua; Mitchell S. Cohen, Ossining; John V. Powers, Shenorock, all of N.Y.; Lung-jo Tao, San Jose, Calif.

[73] Assignee: International Business Machines Corporation, Armonk, N.Y.

[21] Appl. No.: 863,829

[22] Filed: Dec. 23, 1977

[51] Int. Cl.$^2$ .............................................. H01F 10/02
[52] U.S. Cl. .......................................... 365/8; 365/15; 427/127; 427/130; 427/131; 427/132; 428/675; 428/900; 428/928
[58] Field of Search ............................... 427/127–132, 427/48; 428/900, 675, 928; 365/8, 15

[56] References Cited

U.S. PATENT DOCUMENTS

| 4,001,061 | 1/1977 | Ahn et al. | 156/3 |
| 4,104,422 | 8/1978 | Sandfort | 427/130 X |

Primary Examiner—Bernard D. Pianalto
Attorney, Agent, or Firm—Jackson E. Stanland

[57] ABSTRACT

An improved magnetic bubble domain chip and processes for making the chip are described. The chip is comprised of a magnetic bubble domain film in which small bubble domains can be moved, and overlying layers of metallurgy. The layer of metallurgy closest to the bubble film is an electrically conductive layer having apertures (or recesses) therein. This layer is patterned to provide current carrying conductors. The next overlayer is a layer of magnetic material having in-plane magnetization which is patterned to provide the propagation elements used to move the bubble domains. In a particular embodiment, the magnetic layer is comprised of a magnetically soft material, such as permalloy. The chip is characterized by the provision of insulating pedestals located in the apertures of the conductive layer. These insulating pedestals are located in the regions of the chip used for sensing (and/or bubble generation). That is, they take the place of the thick conductive material in those areas of the chip. The sensor and bubble generators are usually portions of the in-plane magnetic layer. If the height of the insulating pedestals is the same as the height of the conductive layer, planarization is achieved and each overlayer lies in a single plane, where the planes are parallel to one another. However, the pedestal can be of any desired height. This chip is particularly advantageous for use with bubble domains having diameters of about 1 micron and less, since the pedestal magnetic chip can be provided by single level masking techniques in which only a single critical masking step is required. The insulating pedestal can be formed prior to deposition of the current carrying conductive layer, or subsequent to deposition of this layer.

25 Claims, 12 Drawing Figures

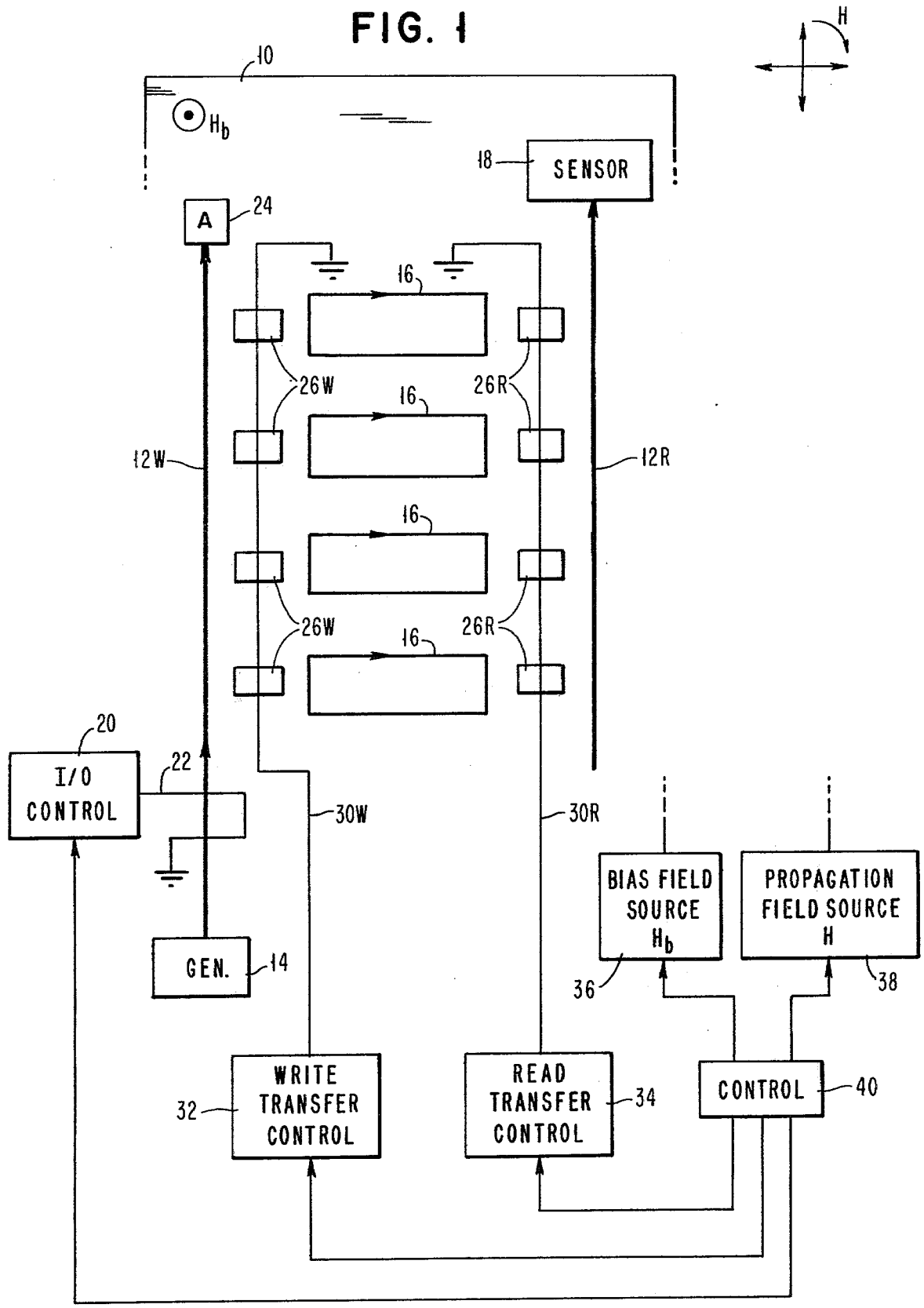

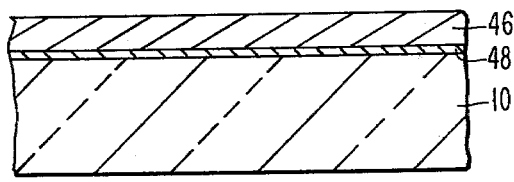
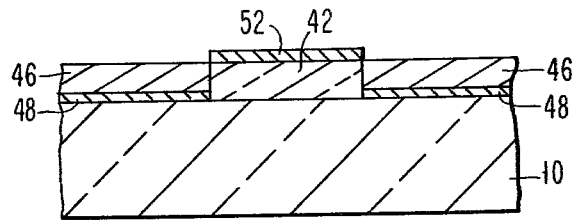
FIG. 3A  FIG. 3E
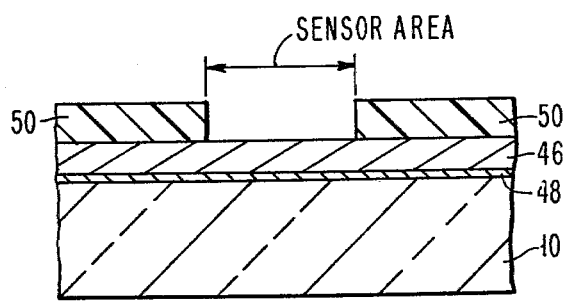
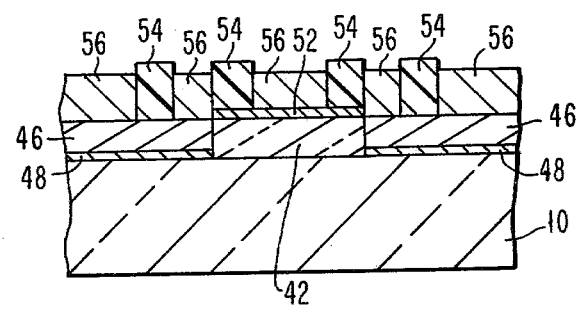
FIG. 3B  FIG. 3F
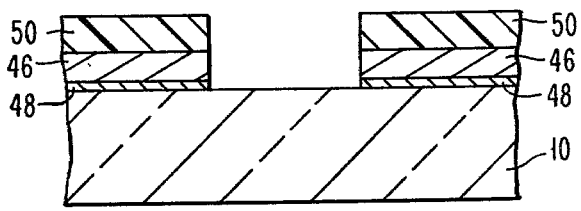
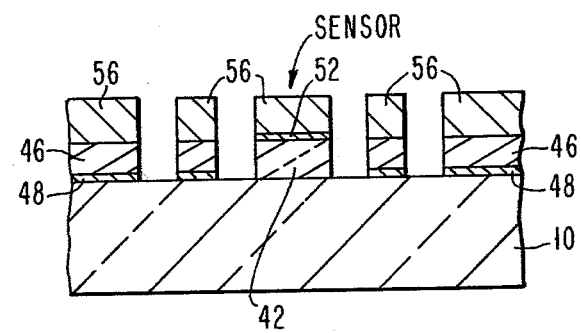
FIG. 3C  FIG. 3G
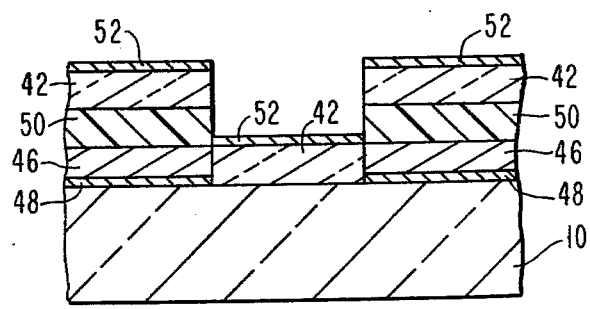
FIG. 3D

PEDESTAL BUBBLE DOMAIN CHIP AND PROCESSES FOR MAKING SAME

BACKGROUND OF THE INVENTION

1. Field of the Invention

This invention relates to improved magnetic bubble domain chips and processes for making these chips using only a single critical masking step, and is more particularly directed to a magnetic bubble domain chip comprising two levels of metallurgy, where one level has apertures (or recesses) therein filled with an electrically insulating material. The insulating material is used in those areas of the chip where the presence of a conductor between a bubble device (magnetic element) and the underlying bubble film would be detrimental to device operation.

2. Description of the Prior Art

Magnetic bubble domain devices are well known in the art and commercial products using this technology are now available. The processing steps used to make a complete magnetic bubble domain chip (having the functions of read, write, storage, transfer, and annihilation) are well known in the art. In one type of processing, called double level metallurgy (DLM), a plurality of masking steps is used where more than one masking step requires a critical alignment. Since alignment is not difficult at the dimensions used for making bubble devices using bubbles of 3 microns diameter and larger, such processes are commonly in use. However, for bubble domains having diameters less than about 3 microns, mask alignment becomes more difficult. For very small bubble domains (of about 2 microns and less in diameter) the concept of single level masking (SLM) has been proposed as a desirable technique.

In SLM processes, more than one masking level may be involved; however, no critical alignment is required and only one level has fine line features. For this reason, such a technique is desirable for the fabrication of ultrahigh density bubble devices and permits the use of electron beam, x-ray, or deep UV conformable mask lithography. Further, in DLM processes, there is often the problem of assuring a smooth transition of a NiFe overlayer over a conductor. Also, it is often necessary in such processes to provide an insulator between the NiFe layer and the conductor.

SLM processes largely avoid the problems described in the previous paragraph. Early SLM processes used bubble device designs in which the bubble propagation elements, sensors, and current-carrying lines were all made of NiFe. In order to reduce the resistance and hence the voltage drop along the lines, it was suggested to use a layered structure comprising a bottom layer of NiFe and an overlayer of gold (Au). Although this structure has considerably lower resistance per unit length of line than a structure using only NiFe, it does require higher switch currents for bubble transfer because the NiFe under the conducting Au layer shielded the current-produced magnetic flux so that it did not penetrate the bubble material lying below the conductor. For this reason, designs of bubble devices have been presented in which the current carrying conductor is located below the NiFe layer, in the areas of the magnetic chip where current carrying conductors are used to determine the paths followed by bubble domains. This structure has the advantage of lowering the resistance of the lines, and also requires less current than the approaches using only NiFe or NiFe—first, Au—second. This is because the current is confined closer to the bubble domain material, and because the NiFe on top of the Au acts as a magnetic yoke which increases the fields in the bubble material.

From a circuit design standpoint, it is known that the presence of the current-carrying conductor beneath the magnetic propagation elements does not adversely affect their function. However, it is desirable to have the magnetic elements used for bubble domain generation and bubble domain sensing close to the magnetic bubble material. If these elements are shielded from the bubble material by a thick current-carrying conductor, their operational margins are severely restricted. Also, the magnetic sensing element cannot be electrically shunted by a conductor. Thus, the problem is to devise a magnetic chip and a SLM process for making it where the conductive layer lies below the magnetic layer used to move the bubble domains, except in the regions of the magnetic chip used for bubble domain generation and bubble domain sensing. Further, it is often desirable to provide a magnetic chip which is essentially planar and a process which achieves planarization, i.e., a process in which each overlayer lies in a single plane substantially throughout the magnetic chip.

Accordingly, it is a primary object of the present invention to provide an improved bubble domain chip and a SLM process for making it.

It is another object of the present invention to provide a new bubble domain chip and a process for making it wherein an insulating pedestal is used to adjust the height of the bubble generator and bubble detector with respect to the underlying bubble material.

It is yet another object of the present invention to provide a new bubble domain chip and a SLM process for making it using conductor-first metallurgy and only one mask alignment.

It is another object of the present invention to provide an improved bubble domain chip and a SLM process for making it, characterized by the use of an insulating pedestal in the regions of the sensor and the generator to insure the planarity of the generator and sensor with respect to an underlying conductor layer.

It is yet another object of the present invention to provide a new bubble domain chip and a SLM process for making it, where the operational margins of the devices in the complete chip are not adversely affected by the process.

It is another object of the present invention to provide a novel bubble domain chip characterized by bi-level metallurgy including at least one electrically conductive non-magnetic layer and one magnetic layer.

It is a further object to provide a planar magnetic bubble domain chip which can be made by a SLM process and which is particularly suitable for manipulating stable bubble domains having diameters of about 20,000 angstroms (two microns) and less.

BRIEF SUMMARY OF THE INVENTION

This invention is primarily directed to a magnetic bubble chip having two levels of metallurgy and to processes for making this chip, using only a single critical masking step. The invention is also primarily directed to a complete bubble domain chip and to a single level metallurgy process for making it, where the chip uses bubbles having very small diameters, of the order of about 2 microns and less.

In the practice of the present invention, a magnetic layer contains magnetic elements used to move magnetic bubble domains in a suitable bubble medium. The magnetic layer is typically comprised of a magnetically soft material such as permalloy. It is used for functions such as bubble propagation, sensing, and bubble generation. It can also be used for other functions such as splitting and annihilation.

An electrically conductive layer provides current-carrying conductors used for several of the functions in the complete chip. For example, the conductive layer provides conductors which electrically contact the bubble sensor and also conductors which are used to determine the path of bubble domains through various transfer switches. Still further, the conductive layer has portions thereof which are conductors for generation, splitting, and annihilation of bubble domains.

The proper operation of some devices in the complete bubble chip requires that the current-carrying conductor be located closer to the bubble domain material than the magnetic layer. An example of such a device is a transfer switch. For still other devices, a conductor cannot be present. For example, in the sensor area of the chip, the sensing element is electrically contacted by a conductor, but the presence of a conductor under the magnetic element reduces the sense signal.

In other portions of the magnetic chip, the presence of an electrically conductive material between the magnetic elements and the bubble film is not harmful. As an example, a conductive material can be located between magnetic propagation elements and the bubble material in the storage area, without undue adverse effects. Thus, certain portions of the magnetic chip require that a current-carrying conductor be located closer to the bubble medium than the magnetic layer, while other portions of the chip are not critical in terms of the relative positions of the conductive layer and the magnetic layer. Still further, certain regions of the magnetic layer cannot be electrically common with the conductor. In these latter regions, the conductor must be either electrically isolated from the magnetic layer or completely absent.

From the foregoing, it is evident that it is difficult to provide planar conductive and magnetic overlayers when all of these constraints have to be met. It is generally desirable to be able to provide planar conductive and magnetic overlayers rather than having to provide multiple levels for each overlayer. Still further, it is desirable to be able to provide these planar overlayers without having to resort to multiple masking steps. Again, when the size of the bubble domain decreases to a very small diameter, it becomes even more important that additional masking levels be eliminated in order to avoid the need for difficult mask alignment. Still further, it is important to avoid a non-planar magnetic overlay having vertical steps in the bubble propagation patterns. These vertical steps cause adverse pole patterns to be generated in response to the reorientation of a magnetic field in the plane of the bubble medium. The presence of these adverse pole patterns impairs bubble propagation, as pointed out in U.S. Pat. No. 4,020,476. In that patent, an attempt is made to correct this problem by selective orientation of the conductors with respect to the propagation pattern.

The present invention has as a primary object the provision of a new bubble domain chip and a new technique for fabricating it. Steps in the magnetic layer are eliminated by a process which requires only a single critical masking step. It is another object of this invention to provide such a chip which can be used with bubble domains of diameter two microns and less.

In accordance with the present invention, planarization of the conductive and magnetic overlayers is achieved by the use of insulating pedestals in certain regions of the magnetic chip. In particular, these pedestals are localized layers of an electrically insulating material, such as SiO, $SiO_2$, Schott glass, $Al_2O_3$, polymers such as resists, etc. The magnetic chip is primarily a "conductor-first" chip where the conductive layer is located closer to the bubble medium than the magnetic layer.

The insulating "pedestals" are usually located in the region of the bubble domain sensor and/or in the region of the bubble domain generator. This means that thick electrically conductive material will not be located under the magnetic elements comprising the generator and sensor, but will be located under the magnetic elements used for transfer switches and propagation in the various storage registers. The presence of the insulating pedestals means that elements such as the sensors and the generators can be elevated to selected heights with respect to the underlying bubble medium in order to provide optimum magnetic coupling to bubbles in the underlying bubble medium. Still further, the height of the insulating pedestal can be equal to the height of the conductive layer so that a planar structure is provided. Various embodiments are described for provision of the insulating pedestal, where the conductive layer is deposited prior to formation of the insulating pedestal, or after formation of the insulating pedestal. Subsequent provision of a patterned magnetic layer for movement of the bubble domains is achieved by a number of techniques known in the art.

These and other objects, features, and advantages will be more apparent from the following more particular description of the preferred embodiments.

BRIEF DESCRIPTION OF THE DRAWINGS

FIG. 1 is a schematic diagram of a bubble domain storage system, and more particularly a major/minor loop memory organization which includes the functions of write, read, store (propagate), transfer, and annihilation.

FIGS. 3A–3G illustrate another process for making a pedestal structure bubble domain chip in accordance with the principles of this invention, in which a patterned layer of electrically conductive material is formed before formation of the insulating pedestal.

DETAILED DESCRIPTION OF THE PREFERRED EMBODIMENTS

Figure 2A:
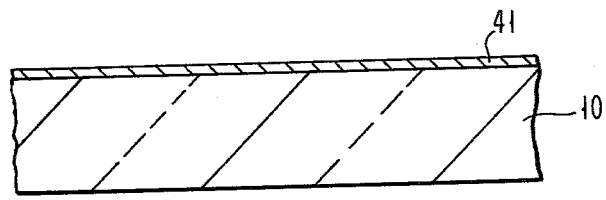
FIGS. 2A–2D illustrate steps in a process used to make a pedestal structure bubble domain chip, wherein a continuous layer of insulating material is deposited and then selectively etched to leave the pedestal.

This invention relates to a magnetic bubble domain storage chip and to processes for making this chip. The magnetic chip is characterized by pedestals of electrically insulating, non-magnetic material which take the place of portions of a thick conductor layer in a conductor-first, magnetic layer-second bubble storage chip. That is, devices in the chip are comprised of two layers of metallurgy on one side of the magnetic bubble medium which may or may not have a non-magnetic spacer layer on it; a first coplanar layer comprising a conductive material and a second coplanar layer comprising a magnetically soft material, where the second layer is more remote from the bubble domain medium (film) than the first layer. Portions of the conductive material in the first layer are absent, their places being taken by an electrically insulating material, such as SiO, $SiO_2$, etc. Often, the thickness of the insulating material is the same as that of the surrounding conductive material, although this need not be so in all cases. If the height of the insulating pedestals is the same as the height of the surrounding conductive material, a planarized structure will be formed in which the magnetic layer lies in a single plane. This avoids the adverse effects which occur when the magnetic layer is not planar.

The bubble domain film often has an insulating layer on it which protects it when the bubble chip is etched to define overlying metal patterns. This insulating spacer layer can be, for instance, 500 A of $SiO_2$.

In a first aspect of this invention, a magnetic bubble domain chip is provided having two planar layers of metallization, the layer closest to the bubble domain film being a conductive layer, while the second metallurgical layer is a magnetic material which is patterned to produce elements along which the bubble domains travel as a magnetic field in the plane of the magnetic film reorients. The magnetic chip is characterized by the presence of small bubble domains having diameters less than about two microns. Insulating material is found in portions of the conductive layer where the conductive layer is totally or partially absent.

In another aspect of this invention, techniques are shown for providing the aforementioned bubble chip, where only a single critical masking level is required and wherein the insulating pedestals can be formed either before or after formation of the conductive layer. The magnetically soft propagation elements can be formed by a subtractive process in which a continuous magnetically soft layer is etched into a pattern, or by an additive process in which the magnetic elements are directly formed over the conductive layer (for example, by plating magnetic elements through a mask). Both additive and subtractive processes for this purpose are well known in the art.

FIG. 1

FIG. 1 shows a conventional major/minor loop memory organization for a bubble domain storage chip. This storage chip includes all of the functions needed for a complete information handling system. That is, bubble devices are provided which generate bubble domains, read bubble domains, store the domains, transfer the domains between different registers, and annihilate the domains. Components for doing each of these functions are well known in the art and will not be described in detail. In general, these components are comprised of a magnetic layer having in-plane magnetization and often include a current-carrying conductor for control of the component.

The storage chip of FIG. 1 includes various bubble devices located over a magnetic medium 10, which is any magnetic medium suitable for maintaining stable bubble domains in the presence of the stabilizing bias field $H_b$. The magnetic chip includes a write major loop 12W and a read major loop 12R. Register 12W is a bubble domain shift register used to move bubble domains from domain generator 14 to positions where the domains can be transferred to the storage loops 16. Read register 12R is a bubble domain shift register which is used to bring domains from the minor loop 16 to the sensor 18 for detection of the information represented by the domains. A 1/0 control 20 provides a current pulse to a conductor loop 22. Loop 22 crosses register 12W and controls the passage of domains from generator 14. In this manner, a pattern of 1's and 0's (presence/absence of bubbles) can be established in register 12W. Domains which are not needed are allowed to propagate to the annihilator 24, where they are destroyed.

Various transfer switches are used to move bubble domains from register 12W to the minor loops 16, and for taking domains from minor loops 16 to the read register 12R. Write-in transfer switches 26W are located between register 12W and each minor loop 16, while read-out transfer switches 26R are located between each minor loop 16 and register 12R. Transfer switches 26W and 26R are usually current-controlled transfer switches. Associated with write-in switches 26W is a write conductor 30W. A read-out conductor 30R is associated with each of the read-out transfer switches 26R. Conductors 30W and 30R are connected to write transfer control 32 and read transfer control 34, respectively. Depending upon the presence or absence of current in conductor 30W, domains will be transferred from input register 12W to the minor loops 16. The transfer of domains from minor loops 16 to the output register 12R depends on the presence or absence of current in the read transfer conductor 30R.

Bias field source 36 is used to provide the stabilizing bias field $H_b$. Source 36 can be any well-known component for providing the bias field, such as permanent magnets, and current-carrying coils.

Propagation field source 38 is used to provide the magnetic drive field H which reorients in the plane of the magnetic medium 10. In response to the reorientation of field H, attractive regions will be produced along magnetic propagation elements for movement of the bubble domains, as is well known. Typically, the propagation field source 38 is comprised of x and y current-carrying coils and the drive field H is a field which rotates in a given constant direction.

A control unit 40 is used to provide timing and synchronization signals to 1/0 control 20, controls 32 and 34, and to field sources 36 and 38.

The storage chip of FIG. 1 is comprised of at least two levels of metallurgy. The first layer of metallurgy, located closest to magnetic medium 10, is a conductive material, such as gold. The second layer of metallurgy, located over the conductive layer, is comprised of a magnetically soft material, such as permalloy. The function of the permalloy layer is to provide propagation elements for movement of the bubble domains, as well as to provide devices such as the generator 14 and the sensor 18. The following portions of this specification will deal with the metallurgical properties of this magnetic chip and processes for making the magnetic chip using only one critical masking step.

OVERLAY FABRICATION PROCESSES

FIGS. 2A-2D

These figures illustrate a process for providing the magnetic chip. In this process, an electrically insulating film is deposited as a continuous film and is then removed except in those portions where a pedestal is to be formed. After this, a conductive layer is deposited and patterned, followed by formation of a patterned magnetic layer, which is used for bubble propagation, sensing, generation, and annihilation.

The first step in the process is the deposition of a thin (few hundred angstroms) plating base layer 41. The choice of metal for layer 41 is unimportant. If hard-bubble suppression is desired, the metal permalloy (NiFe) is chosen. This layer is deposited directly on the bubble material 10 as shown in FIG. 2A.

Figure 2B:
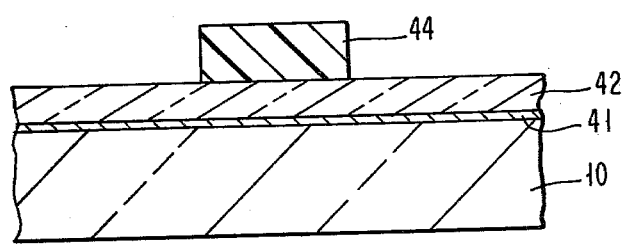
Figure 2C:
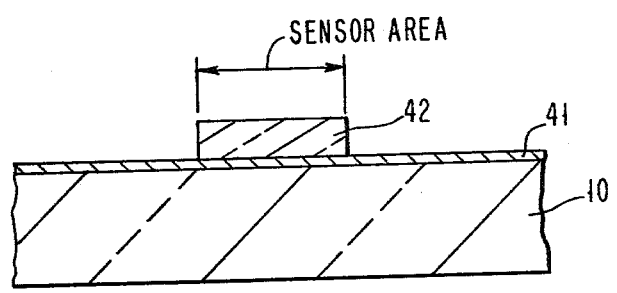

In FIG. 2B, an insulating layer 42 (such as SiO₂) is deposited which is of the thickness desired for magnetically optimum spacing of the propagation elements to be formed later. Layer 42 is used for the insulating pedestal and is, for example, roughly 2000-4000 Angstroms thick if 2 micron bubbles are to be propagated. After this, a patterned resist layer 44 is applied. Using a crude masking process (large alignment tolerances), followed by a suitable etching step (chemical or ion beam), the insulating layer 42 is removed everywhere except in the general sensor (and generator) areas, as shown in FIG. 2C. Insulating pedestal 42 (FIG. 2C) can be considerably larger in lateral extent than the dimensions of the sensor proper. This, it can extend to many propagation elements beyond the sensor without adverse effects.

Figure 2D:
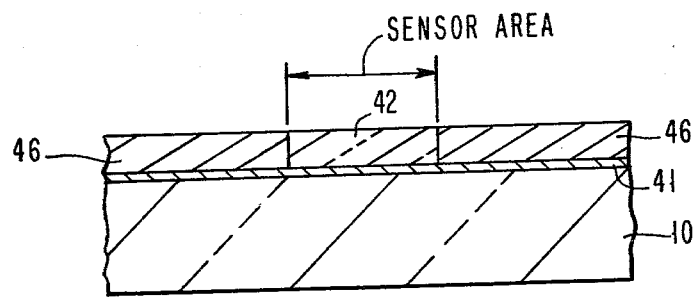

In FIG. 2D, the conductive layer 46 (using the same reference numerals for the basic portions of the metallurgy as described previously) is plated onto plating base layer 41. This plating continues until the conductive layer (such as gold) has a height substantially equal to the height of the insulating pedestal 42.

After this, a patterned magnetic layer is provided for formation of magnetic propagation elements. Either additive or subtractive processes, well known in the art, can be used for this purpose. For example, a continuous layer of permalloy can be deposited over the entire structure of FIG. 2D, and then patterned. One way to do this is by applying a resist layer, exposing and developing it, to make a mask, then etching the permalloy through the resist mask to define the pattern of propagation elements, sensors, and conductors for a complete bubble chip. This etching step also defines a conductor pattern in layer 46 and removes unwanted portions of layer 41. Ion milling or sputter etching is an effective etching technique.

In FIGS. 2B and 2C, layer 42 need not be etched all the way through to the bubble film 10 if the conductive layer 46 is deposited by evaporation or sputtering. If plating is to be used, then a plating base layer 41 has to be present. If a thin layer of dielectric is left, it can serve to protect the rest of the bubble film during the etching step which defines conductors in layer 46 and propagation elements in the overlying magnetic layer.

All elements forming the bubble devices are now spaced from the bubble film by the desired distance, which is determined by magnetic considerations. However, the conductors are all closely adjacent to the bubble film and are overlayed by permalloy. The permalloy gives flux closure in a direction which aids a field produced by current through the conductors. Some of the bubble elements, such as propagation elements and transfer switches, are spaced from the bubble material by the metal layer 46, while other bubble components, such as the sensor and/or the generator, are spaced from the bubble material by the insulating layer 42.

The procedure of FIGS. 2A-2D can be varied in one step in order to prevent the possibility of a short circuit between the plating base 41 and the sensor elements. For this purpose, the plating base is not applied first, but is applied after the insulating island 42 has been formed, but before the resist 44 is removed from the top of that island. It will be possible to employ a very thick resist layer 44 so that lift-off of the unwanted plating base in the region of the insulating pedestal will be possible, while the plating base will be retained elsewhere.

FIGS. 3A-3G show another process for making a complete bubble domain chip in accordance with the principles of this invention. The same reference numerals will be used for the bubble film 10, insulating layer 42, and conductive layer 46. In step 1, a thin layer 48 is deposited on bubble film 10. As an example, this can be NiFe deposited to a thickness of 500-600 Angstroms. Layer 48 serves as an adhesive layer for a later metallization, and as a suppressor for hard bubbles in bubble film 10. It also serves as a reflector for ease of bubble observation by optical techniques. The primary purpose of layer 48 is for adhesion, and an underlayer of Ti-Au would work well when Au is deposited thereover. The conductor layer 46, typically gold, is deposited (evaporated or sputtered) to a thickness of about 3000 Angstroms.

In FIG. 3B, secondary lithography is applied. This comprises a patterned resist layer 50 in which the areas for sensors and other components which cannot tolerate the presence of NiFe are patterned using optical lithography. No alignment is required.

In FIG. 3C, layer 46 and base layer 48 are etched using resist 50 as a mask. Ion milling is preferred because of its high milling rate (approximately 800 Angstroms/min for gold) and because the resulting sidewall contours are suitable. However, chemical etching may be used advantageously to obtain some undercuts in conductive layer 46. At this stage of the process, resist layer 50 has been reduced in thickness by about 2000-3000 Angstroms, but the bulk of it remains.

In FIG. 3D, an insulating layer 42 is deposited. This layer is typically SiO which is deposited to a thickness of about 3000 Angstroms by a lift-off process. Layer 42 will fill the etched areas in the structure of FIG. 3C and make the surface planar in that region with the top of the adjacent portions of conductive layer 46. A thin layer 52 is also deposited on the SiO to serve as a plating base. Layer 52 is typically NiFe having a thickness of about 300 Angstroms. The SiO layer maintains adequate electrical insulation between the sensors (to be formed later) and the underlayer 48.

After this, lift-off is used to remove resist 50. The thick resist layer 50 (typically greater than 10,000 Angstroms in thickness) helps the lift-off process. Also, the adhesion of the insulating layer 42 is enhanced by mechanical anchoring, since it is squeezed into the channels formed by the conductive layer 46. SiO is brittle as compared with metallic films and this helps the lift-off process since SiO will break away from the SiO channel when the resist 50 is removed. FIG. 3E shows the structure comprising the bubble film 10, adhesion layer 48, insulating layer 42, and conductive layer 46.

After this, high resolution lithography is applied for forming the magnetic propagation elements, sensors, generators, and annihilators. This is a patterned resist layer 54 which has a thickness of approximately 6000 Angstroms. A vector-scan electron beam system is an ideal tool for this step, because it can scan the wafer and align the electron beam with respect to the sensor areas. Using mask 54, magnetically soft material (such as permalloy) is electroplated to form layer 56. Layer 56 is approximately 4000 Angstroms thick and comprises the propagation elements used to move the bubble domains. The extra thickness of layer 56 allows for removal of some of this layer during later ion milling of the underlying conductor layer 46.

After electron-beam resist 54 is removed, the entire structure is ion milled using the plated permalloy 56 as a milling mask. The resulting structure is shown in FIG. 3G, where unmasked portions of conductor layer 46 and adhesion layer 48 are removed. This forms patterns in the conductive layer. A light overmilling (by 50-100 Angstroms) is desirable to insure electrical isolation of all conductor lines, and it is a built-in safety feature for processing. At the end of this process the following thicknesses remain:

Sensors (and/or generators)—3300 Angstroms Permalloy

Propagation Elements—3300 Angstroms Permalloy on 3000 Angstroms gold (layer 46), on 300 Angstroms Permalloy (layer 48).

The entire wafer is now ready for further processing of coincidence selection metallization, or can be diced into chips for wire bonding.

In the practice of this invention, an improved magnetic bubble domain chip is provided in which selective areas of the chip contain elements having a conductive layer below a magnetic layer, while other areas of the chip contain magnetic elements located over a non-magnetic, electrically insulating layer. This provides an essentially planar structure and therefore avoids vertical steps in the overlying magnetic layer.

In the further practice of this invention, the thickness of the insulating pedestals can be varied slightly if it is desired to have the sensors closer or farther from the magnetic bubble film. However, it is generally desired that the magnetic propagation elements be separated from the underlying bubble film by a distance which will optimize propagation of the underlying bubbles. Generally, this determines the thickness of both the conductive layer and the insulating pedestal. In this manner, a planar structure is provided by a process in which only one masking step is critical. Also, it may be suitable to have a thin conductor under the insulating pedestal, rather than a complete absence of conducting material. In this situation, a recess would exist in the conductor layer which would be covered with insulating material to a height generally equal to the height of the rest of the conductor layer.

Thus, the magnetic chip is characterized by double layer metallurgy wherein portions of the metallurgy comprise a thick conductive layer under a magnetic layer and other portions of the metallurgy comprise an electrically insulating layer under the magnetic layer. In contrast with prior art bubble chips in which continuous insulating layers are used for magnetic spacers, the present chip has electrically insulating material in the form of islands, or pedestals, only in selected areas of the chip. These islands or pedestals are at least partially surrounded by a conducting material having essentially the same height as the insulating pedestal.

Although the broad principles of this invention have been illustrated by several embodiments, it will be obvious to those of skill in the art that variations to these embodiments can be conceived which are consistent with these principles.

What is claimed is:

1. A magnetic bubble domain chip comprising a plurality of devices for manipulating bubble domains in a magnetic bubble film, comprising:

a magnetic bubble domain sensor for detection of said bubble domains, propagation elements forming shift registers for moving said bubble domains in said magnetic film, write devices for generating bubble domains in said magnetic film, and transfer switches for changing the path of bubble domains in said film, said shift register propagation elements and transfer switches being comprised of two levels of metallurgy, including a first layer of an electrically conductive, non-magnetic material and a second layer comprising a magnetically soft material, said sensor being comprised of a portion of said magnetically soft material, an insulating pedestal located under said sensor and localized in the general region of said sensor, said insulating pedestal being surrounded by portions of the conductive material comprising said first layer, wherein said first and second layers are substantially planar, and parallel to one another and to said bubble domain film and wherein all of the propagation elements forming said registers are in the same plane.

2. The structure of claim 1, wherein said first layer is comprised of gold, said second layer is comprised of permalloy, and said bubble domain film has a garnet structure.

3. The structure of claim 1, where said insulating pedestal is comprised of a non-magnetic material.

4. The structure of claim 1, where said bubble domain sensor and said propagation elements are comprised of permalloy.

5. The structure of claim 1, where said write device is comprised of a portion of said second magnetically soft layer, said insulating pedestal being located between said portion of magnetically soft material and said bubble domain film, and being in contact with said portion of magnetically soft material.

6. The structure of claim 1, where said first layer is in contact with said second layer.

7. The structure of claim 1, where said magnetic bubble domains have diameters not exceeding about 2 microns.

8. A magnetic bubble domain chip comprising devices for writing magnetic bubble domains, reading magnetic bubble domains, and propagating magnetic domains, comprising:

a magnetic film in which stable bubble domains can be moved, a first layer of electrically conductive, non-magnetic material located over said magnetic bubble domain film and patterned to provide portions thereof for carrying electrical current, a second layer located over said first layer, said second layer comprising magnetically soft material which is patterned to form both magnetic propagation elements along which said bubble domains move in response to the reorientation of a magnetic field substantially in the plane of said second layer and a sensor for sensing the presence of said bubble domains, wherein at least one portion of said first layer of electrically conductive, non-magnetic material has an aperture therein filled with an electrically insulating material localized in the region of said aperture, there being a portion of said second layer forming said sensor overlying and in contact with said insulating material in said aperture and wherein said propagation elements and said sensor are in substantially the same place.

9. The structure of claim 8, wherein said first and second layers are substantially planar and parallel to one another.

10. The structure of claim 8, wherein the thickness of said insulating material is substantially the same as the thickness of the surrounding portions of said conductive layer.

11. The structure of claim 10, where said insulating material is located below said bubble domain sensor, and said bubble domains have diameters of approximately 2 microns and less.

12. A magnetic bubble domain chip for providing an information handling system using magnetic bubble domains to represent information, comprising:
   a magnetic film in which said bubble domains can be manipulated,
   a first layer of electrically conductive, non-magnetic material adjacent to said bubble domain film, defining a plane parallel to the plane of said bubble domain film and having at least one aperture therein,
   an island of electrically insulating material located in said aperture,
   a second layer of magnetically soft material having a first portion thereof located over said first layer and a second portion thereof located over said island, where said first and second portions are substantially parallel to said first layer and wherein all of the magnetically soft material in said first portion lies in a single plane.

13. The structure of claim 12, where said island of electrically insulating material has a thickness substantially equal to the thickness of said first layer.

14. The structure of claim 13, wherein said bubble domain film has properties such that stable bubble domains in said film have diameters not exceeding about 2 microns.

15. The structure of claim 14, wherein said first layer is patterned and includes portions thereof for carrying electrical current, and said second layer is also patterned and includes propagation elements along which magnetic bubble domains move in response to the reorientation of an applied magnetic field.

16. The structure of claim 15, wherein said first portion of said second layer is located in contact with said first layer and wherein said second portion of said second layer is located in contact with the top surface of said insulating island.

17. A magnetic bubble domain chip including a magnetic bubble domain film in which stable bubble domains can be moved,
   bubble domain propagation devices comprising two non-coplanar layers, said first layer being a magnetically soft layer separated from said bubble domain film by a second layer which is comprised of a non-magnetic, electrically conductive material having at least one aperture therein, said propagation devices forming storage registers for moving said bubble domains in response to the reorientation of a magnetic field substantially in the plane of said first layer,
   an island of electrically insulating material located in said aperture and lying in a plane between said first layer and said bubble domain film,
   a bubble domain sensor for detection of said bubble domains, said sensor being comprised of a first portion of said magnetically soft layer wherein said first portion is located over said island of insulating material and wherein said magnetically soft layer forming said storage registers is located in a single plane.

18. The magnetic chip of claim 17, wherein said propagation devices comprise magnetically soft propagation elements which are separated from one another.

19. The magnetic chip of claim 17, where the thickness of said electrically insulating island is substantially equal to the thickness of said second conductive layer.

20. The structure of claim 17, where said first layer is substantially planar.

21. The magnetic chip of claim 17, where portions of said second conductive layer electrically contact said bubble domain sensor.

22. The structure of claim 17, where said bubble domain film has magnetic properties characterized by the storage of stable bubble domains therein having diameters not exceeding about 20,000 Angstroms.

23. The magnetic chip of claim 21, where said first and second layers are substantially planar, and further including a bubble domain generator comprising a second portion of said magnetically soft material located over another aperture in said second conductive layer having an electrically insulating material in said second aperture.

24. The magnetic chip of claim 23, wherein said first and second portions of said magnetically soft material are non-coplanar with the magnetically soft material forming said storage registers.

25. The magnetic chip of claim 23, wherein said first layer of magnetically soft material is located in a single plane.

* * * * *